US008476589B2

(12) United States Patent
Benner et al.

(10) Patent No.: US 8,476,589 B2
(45) Date of Patent: Jul. 2, 2013

(54) PARTICLE BEAM MICROSCOPE

(75) Inventors: Gerd Benner, Aalen (DE); Stefan Meyer, Aalen (DE); Steffen Niederberger, Gerstetten (DE); Dirk Preikszas, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 13/539,291

(22) Filed: Jun. 29, 2012

(65) Prior Publication Data

US 2012/0326032 A1 Dec. 27, 2012

Related U.S. Application Data

(63) Continuation-in-part of application No. 13/337,268, filed on Dec. 26, 2011.

(30) Foreign Application Priority Data

Dec. 27, 2010 (DE) ........................ 10 2010 056 321

(51) Int. Cl.
*H01J 37/244* (2006.01)

(52) U.S. Cl.
CPC .................................... *H01J 37/244* (2013.01)
USPC .......................................... 250/310; 250/397

(58) Field of Classification Search
USPC ................................................. 250/310, 397
See application file for complete search history.

(56) References Cited

U.S. PATENT DOCUMENTS 5,274,237 A * 12/1993 Gallagher et al. ....... 250/370.15
5,317,154 A * 5/1994 Honda ............................. 850/9
5,569,925 A * 10/1996 Quinn et al. ............ 250/370.06
2010/0148064 A1 6/2010 Harrach et al.

OTHER PUBLICATIONS

D. B. Williams et al., "Coherent Bremsstrahlung" (Chapter 33.4.C.), Transmission Electron Microscopy, Spectrometry, vol. IV, 1996, p. 583.

P. Schlossmacher et al., "Nanoscale Chemical Compositional Analysis with an Innovative S/TEM-EDX System", Microscopy and Analysis Nanotechnology Supplement, vol. 24, No. 7, Nov. 2010, pp. 5-8.

Office action in German patent application No. 10 2010 056 321.8 dated Jul. 14, 2011, 6 pp. (with English translation, 4 pp.).

* cited by examiner

*Primary Examiner* — Kiet T Nguyen
(74) *Attorney, Agent, or Firm* — Bruce D Riter

(57) ABSTRACT

A particle beam microscope comprises a magnetic lens 3 having an optical axis 53 and a pole piece 21. An object 5 to be examined is mounted at a point of intersection 51 between an optical axis 53 and the object plane 19. First and second X-ray detectors 33 have first and second radiation-sensitive substrates 35 arranged such that a first elevation angle $\beta_1$ between a first straight line 55$_1$ extending through the point of intersection 51 and a center of the first substrate 35$_1$ and the object plane 19 differs from a second elevation angle $\beta_2$ between a second straight line 55$_2$ extending through the point of intersection 51 and a center of the second substrate 35$_2$ and the object plane 19 by more than 14°.

19 Claims, 8 Drawing Sheets

PARTICLE BEAM MICROSCOPE

CROSS-REFERENCES TO RELATED APPLICATIONS

This application is a continuation-in-part of pending U.S. patent application Ser. No. 13/337,268 filed 26 Dec. 2011, the entire content of which is incorporated herein by this reference.

The present application claims priority of German Patent Application No. 10 2010 056 321.8, filed Dec. 27, 2010, entitled "PARTICLE BEAM MICROSCOPE", the contents of which is hereby incorporated by reference in its entirety.

FIELD

The invention relates to particle beam microscopes having an energy dispersive X-ray detector.

BACKGROUND

In such particle beam microscopes, X-ray radiation is generated by means of a focused particle beam generated by the particle beam microscope in an object to be inspected, wherein a spectrum of the X-ray radiation is recorded by the X-ray detector. From an analysis of the recorded X-ray spectrum, it is possible to deduce a composition of the object at the location of the incident particle beam. The particle beam microscope can be designed as an electron microscope, in particular a transmission electron microscope, or as an ion microscope, such as a helium gas field ion microscope, for example.

It has been found in conventional particle beam microscopes of this type that the X-ray spectra obtained during a reasonable measurement time have an excessively small number of detected X-ray events in order to determine the composition of the object at the location of the impinging particle beam with a desired significance.

SUMMARY

Accordingly, it is an object of the present invention to provide a particle beam microscope having an X-ray detector allowing to evaluate recorded X-ray spectra with increased significance.

According to an embodiment, a particle beam microscope comprises a magnetic lens having an optical axis and at least one front pole piece arranged in the beam path along the optical axis at a distance upstream of an object plane, an object holder, which is configured for mounting an object to be examined at a point of intersection between the optical axis and the object plane, a vacuum enclosure defining a vacuum space and having an opening, wherein the front pole piece of the magnetic lens and the object are located within the vacuum space, and an X-ray detection unit, wherein the X-ray detection unit comprises a first X-ray detector having a first radiation-sensitive substrate, and a second X-ray detector having a second radiation-sensitive substrate.

The X-ray detection unit may further comprise a detector mount on which the first and second X-ray detectors are mounted, and a flange mounted on and sealed against the vacuum enclosure, wherein the flange carries the detector mount such that at least one of a portion of the flange and the detector mount extend through an opening of the vacuum enclosure. The flange and the opening may have diameters such that the X-ray detection unit can be removed from the particle beam microscope without dismantling the vacuum enclosure. This may have an advantage when a defect of the X-ray detectors occurs such that they have to be removed from the microscope. For this purpose, the whole X-ray detection unit can be removed from the microscope, and a suitable flange can be used to close the opening of the vacuum enclosure, such that the microscope can continue to operate in it's normal detection modes not involving the X-ray detectors of the X-ray detection unit.

According to some embodiments, the detector mount is displaceable relative to the flange such that the first and second X-ray detectors are displaceable from a measuring position near the point of intersection to a parking position farther away from the point of intersection.

According to exemplary embodiments herein, the microscope further comprises a displaceable shutter plate which is arranged between the first and second radiation-sensitive substrates and the point of intersection when the first and second X-ray detectors are positioned in the parking position, and which is not arranged between the first and second radiation-sensitive substrates and the point of intersection when the first and second X-ray detectors are positioned in the measuring position.

According to a particular embodiment herein, the first and second X-ray detectors are arranged such that a first elevation angle between a first straight line, which extends through the point of intersection and a center of the first substrate, and the object plane differs from a second elevation angle between a second straight line, which extends through the point of intersection and a center of the second substrate, and the object plane by more than 14°.

According to an exemplary embodiment, the first X-ray detector is arranged upstream of the object plane, as seen in the beam direction, on a side oriented towards the particle beam source, and the second X-ray detector is arranged downstream of the object plane on a side oriented away from the particle beam source.

According to further embodiments, the substrates of the first and second X-ray detectors are arranged at different elevation angles with respect to the object plane. This may have a consequence that the composition of the X-ray radiation impinging on the two substrates differs. Specifically, two types of X-ray radiation impinge on the substrates:

Firstly, this is the characteristic X-ray radiation which is generated by the particle beam impinging on the object as a result of excitation of electronic transitions in atoms and molecules of the object. The spectrum of characteristic X-ray radiation allows to extract information relating to the composition of the object at a location of the incident particle beam. The characteristic X-ray radiation is emitted from the location of incidence of the particle beam on the object substantially isotropically, i.e. substantially uniformly distributed in the different spatial directions.

Secondly, this is the X-ray bremsstrahlung, which arises as a result of deflection of the particles impinging on the object in the electric field of atomic nuclei of the object. The X-ray bremsstrahlung is emitted anisotropically and with increased intensity in the forward direction from the point of view of the particle beam impinging on the object. The X-ray bremsstrahlung contributes to a background of a recorded X-ray spectrum, and the proportion of the recorded spectrum that is constituted by the spectrum of the characteristic X-ray radiation can be calculated by subtracting this background.

Since the substrates of the two detectors are arranged at different elevation angles with respect to the object plane, substantially identical proportions of the substantially isotropically emitted characteristic X-ray radiation, but different proportions of the anisotropically emitted X-ray bremsstrahlung, impinge on the detectors, wherein identical distances between the substrates and the impingement location of the particle beam on the object are assumed. As a result, it is possible, by suitable analysis of the X-ray spectra recorded by the two detectors, to determine the respective proportion of X-ray bremsstrahlung impinging on the substrates with a comparatively high accuracy and to subtract it from the recorded spectra, such that the remaining portions of characteristic X-ray radiation can be calculated precisely, and the composition of the object at the impingement location of the particle beam can be determined therefrom with a relatively high significance. In this case, it is possible to determine not only the proportions of continuous bremsstrahlung but also, in particular, the portions of coherent bremsstrahlung occurring as peaks in the X-ray spectrum. Such peaks are generated by crystalline objects and it is particularly difficult to distinguish those from the continuous bremsstrahlung. Background information concerning coherent bremsstrahlung can be gathered from Chapter 33.4.0 of the book Transmission Electron Microscopy: A Textbook for Materials Science (4-Vol Set): David B. Williams, C. Barry Carter, Spectrometry IV, 1996, Plenum Press, New York. From the spectra recorded by the detectors arranged at different elevation angles, the proportions of continuous bremsstrahlung and coherent bremsstrahlung can be determined separately in each case.

Moreover, the number of two detectors arranged near the location of incidence of the particle beam on the object allows the detection of an increased number of X-ray quanta and thus a shortening of the required measurement time.

In accordance with a further embodiment herein, a third and a fourth X-ray detector, and if appropriate even further X-ray detectors, are also provided, which can likewise be arranged at different elevation angles with respect to the object plane and which, however, are arranged, as seen about the optical axis, at different azimuth angles by comparison with the substrates of the first and second X-ray detectors. In particular, the substrate of the third X-ray detector can be arranged in a manner lying diametrically opposite the substrate of the first X-ray detector with respect to the point of intersection between the optical axis and the object plane. Likewise, the substrate of the fourth X-ray detector can be arranged in a manner lying diametrically opposite the substrate of the second X-ray detector with respect to the point of intersection.

In accordance with a further embodiment, a particle beam microscope comprises a magnetic lens having an optical axis, which comprises a front pole piece, which is arranged in the beam path along the optical axis at a distance upstream of an object plane, and a rear pole piece, which is arranged in the beam path along the optical axis at a distance downstream of the object plane, an object holder, which is configured for mounting an object to be examined at a point of intersection between the optical axis and the object plane, a first X-ray detector having a first radiation-sensitive substrate, and a second X-ray detector having a second radiation-sensitive substrate, wherein provision is furthermore made of an actuator, or drive, and a shutter, which can be moved from a first position to a second position by the actuation of the actuator and which is configured such that the shutter in the first position is arranged between the point of intersection between the optical axis and the object plane and both the first and the second substrate, in order to block impingement of X-ray radiation and stray particles emerging from the object that can be arranged at the point of intersection on the first and second substrates, and in the second position is arranged such that the X-ray radiation and stray particles emerging from the object that can be arranged at the point of intersection can impinge on the first and the second substrate.

In some operating situations there is the risk of the substrates of the detectors being contaminated by contaminations or being exposed to an excessively high dose of electrons. This is the case, for example, when a beam current of the particle beam impinging on the object is very high and detaches particles from the object or the particle beam microscope is operated with low magnetic excitation of the objective lens, such that in the region of the object an excessively low magnetic field is present for avoiding the impingement of excessively high electron intensities on the detectors.

In such operating situations it is now possible to move the shutter into its first position, in which it protects the substrates against the impingement of contaminations and electrons. In this case, a single shutter with a single actuator is associated with a plurality of detectors or detector substrates, such that a plurality of detectors can be protected by the actuation of the single actuator.

In accordance with one embodiment herein, the shutter also provides the function of a collimator, which restricts or defines a solid angle range from which the detector can receive X-ray radiation. This solid angle range contains a region of the object around the point of intersection between the optical axis and the object plane in order to receive the desired X-ray radiation that is caused by the impinging particle beam and emerges from the object, wherein the solid angle range, in accordance with the structural space available for the shutter, is restricted as far as possible in order that the impingement of X-ray radiation which does not originate from the object, such as, for example, stray radiation that arises at the pole pieces of the magnetic lens, is not permitted to pass to the detector. For this purpose, the shutter may comprise a shutter surface which is arranged at a distance from the substrate and has an aperture which allows X-ray radiation to pass through towards the respective detector only in the second position. A cross-sectional area of the aperture can be, in particular, significantly smaller than a cross-sectional area of the associated substrate in order to significantly restrict the solid angle range from which X-ray radiation can impinge on the detector.

In accordance with one embodiment herein, the shutter comprises a tubular piece, which in the second position of the shutter extends from the aperture towards the substrate of the detector. Said tubular piece can, in particular, expand conically proceeding from the aperture towards the substrate.

In accordance with embodiments, the substrate areas of the detectors are comparatively small and have an area of less than 50 $mm^2$, and in particular less than 20 $mm^2$. In comparison with large-area detectors conventionally used, such small detectors allow a high energy resolution to be obtained in conjunction with low detector noise and low costs.

This makes it possible to arrange the detectors near the point of intersection between the optical axis and the object plane and, although the area of the substrates is comparatively small, nevertheless, as seen from the point of intersection, to cover a comparatively large solid angle range by the substrates of the detectors. Together with the provision of collimators whose openings facing the object, in accordance with the area of the substrates, are likewise comparatively small, this affords the advantage in comparison with large-area detector substrates arranged farther away from the point of intersection between the optical axis and the object plane that an approximately identical solid angle range around the point of intersection can be covered with detection areas, and the impingement of undesired stray radiation on the detectors is significantly suppressed on account of the small diameters of the entrance cross sections of the collimators.

Distances between the substrates and the point of intersection between the optical axis and the object plane can be, for example, less than 12 mm or 20 mm.

BRIEF DESCRIPTION OF THE DRAWINGS

The forgoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

Figure 1:
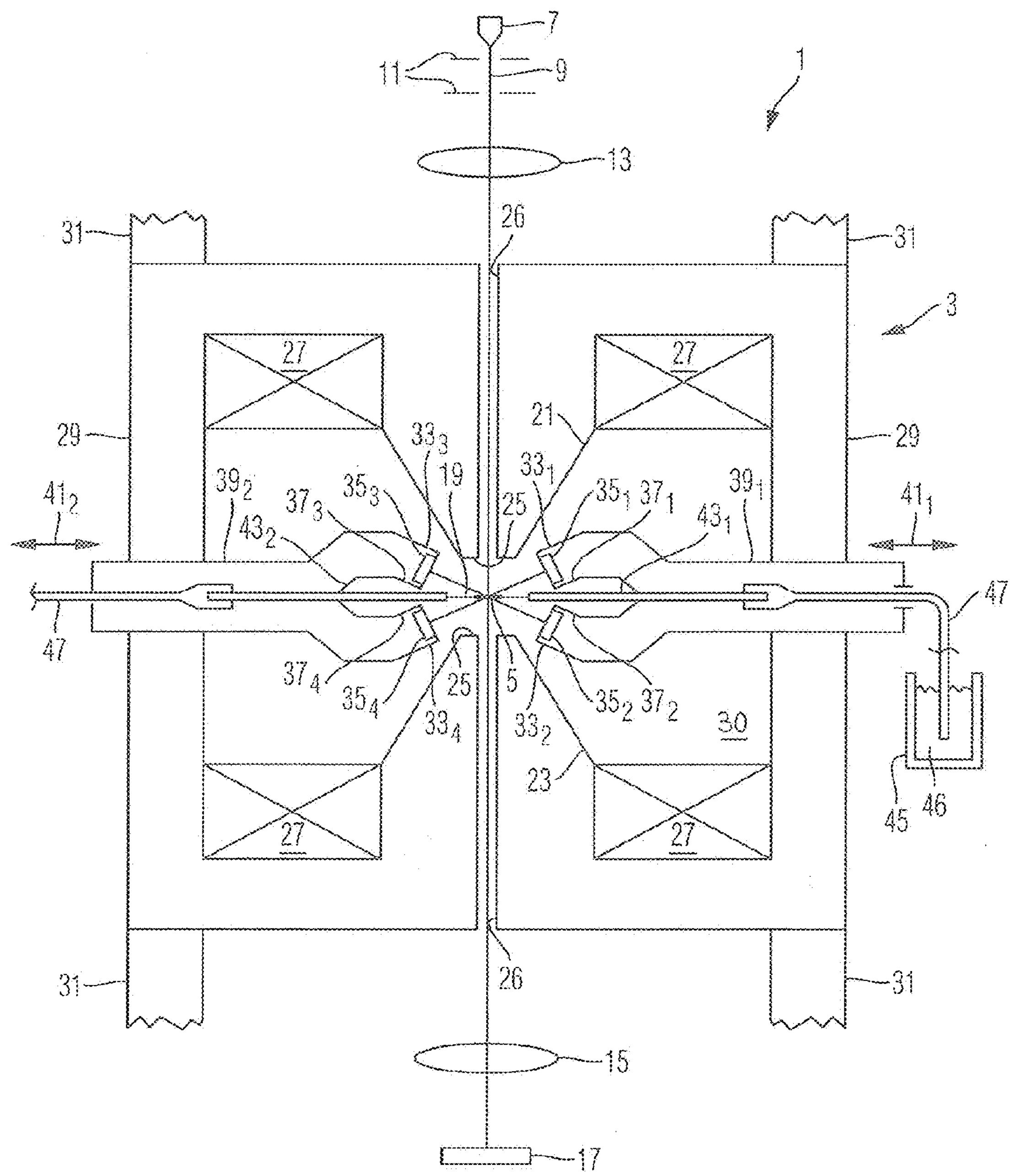
FIG. 1 is a schematic illustration of a particle beam microscope in a longitudinal section.

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

FIG. 1 is a schematic illustration of a particle beam microscope 1 designed as a transmission electron microscope, wherein the illustration shows an electron-optical lens 3, which generates a focusing magnetic field in the region of an object 5 to be examined, schematically in longitudinal section and further components of the electron microscope 1 functionally in schematic fashion. The electron microscope 1 comprises an electron beam source 7 for generating an electron beam 9, a plurality of electrodes 11 for shaping and accelerating the beam 9, and one or more condenser lenses 13 or other electron-optical components for further shaping and manipulating the beam 9 before the latter enters into the lens 3. The further components can comprise, for example, a monochromator, a corrector for correcting optical aberrations of the lens 3, and deflectors for scanning the beam 9 over the object 5.

In the beam path downstream of the lens 3, it is possible to arrange further electron-optical components 15, such as projective lenses, diaphragms, phase plates, biprisms, correctors, spectrometers and the like, and finally one or more detectors 17.

The objective lens 3 focuses the electron beam 9 in an object plane 19, in which the object 5 to be examined is arranged. The beam 9 passes through the object 5, wherein interactions between the object and the beam influence the latter for example with regard to the kinetic energies or the trajectories of the electrons of the beam.

Such influences are detected by the one or the plurality of detectors 17 and evaluated in order to obtain therefrom information about the object.

The lens 3 generates a magnetic field that focuses the electron beam 9 between two pole pieces 21, 23, of which one (21) is arranged in the beam path upstream of the object plane 19 and the other (23) is arranged in the beam path downstream of the object plane. The pole pieces 21, 23 each have a through-hole 26, through which the electron beam 9 passes. Furthermore, the pole pieces 21, 23 in each case taper towards the object plane 19 and in each case have an end surface 25 facing the object plane 19, from which field lines of the focusing magnetic field exit and enter, respectively. The magnetic field is generated by windings 27 through which current flows and which surround the pole pieces 21 and 23 in a ring-shaped fashion. The magnetic flux between the pole pieces 21 and 23 is closed by means of a cylindrical metallic yoke 29, which also defines a vacuum space 30 surrounding the object 5. Further components 31 of the vacuum enclosure adjoin the yoke 29 upwards towards the electron source 7 and downwards towards the detector 17 in the illustration in FIG. 1, such that the electron source 7 and the detector 17 are also arranged within the vacuum.

X-Ray detectors $33_1$, $33_2$, $33_3$ and $33_4$ are furthermore arranged in the vacuum space 30 in the vicinity of the object 5, in order to detect X-ray radiation which is generated by the electron beam 9 as a result of the impingement thereof on the object 5. The X-ray detectors 33 each comprise a radiation-sensitive substrate $35_1$, $35_2$, $35_3$ and $35_4$, which is designed for detecting X-ray radiation and generating electrical signals which represent the energy of detected X-ray quanta. The substrates 35 are mounted on substrate mounts $37_1$, $37_2$, $37_3$ and $37_4$ such that they are arranged at predetermined distances from and at predetermined orientations with respect to the object 5, as will be described in detail below. In particular, one or a plurality of substrates $35_1$, $35_3$ are arranged upstream of the object plane as seen in the beam direction, and one or a plurality of substrates $35_2$, $35_4$ are arranged downstream of the object plane as seen in the beam direction.

The two X-ray detectors $33_1$ and $33_2$ are jointly mounted on a tube $39_1$, which extends through the vacuum enclosure or the yoke 29 and is sealed relative thereto. The tube $39_1$ can be moved to and fro in a direction represented by an arrow $41_1$, in order to displace the detectors $31_1$ and $31_2$ from their measurement position illustrated in FIG. 1, in which measurement position the substrates $35_1$, $35_2$ of the detectors $33_1$, $33_2$ are arranged near the object 5, into a parking position drawn back farther away from said object. In a similar manner, the detectors $33_3$ and $33_4$ are mounted on a tube $39_2$, which likewise passes through the vacuum enclosure 29 and is sealed relative thereto, and can be moved in a direction represented by an arrow $41_2$ in order to move the detectors $33_3$ and $33_4$ from a measurement position near the object 5 into a parking position drawn back at a distance from said object. The detectors 33 are moved into the measurement position if the detectors are intended to detect X-ray radiation generated by the impingement of the electron beam 9 on the object 5. The detectors 33 are arranged in the parking position if X-ray radiation is not intended to be detected, such that possibly other components such as, for example, other detectors, heat sinks or diaphragms can be arranged near the object.

A cooling plate $43_1$ is arranged between the two detectors $33_1$ and $33_2$, said cooling plate being in contact with a cold reservoir 45 of liquid nitrogen 46, for example, via a cold conductor 47, such as a flexible copper multiple-stranded wire, for example. The cooling plate $43_1$ is provided for cooling a vicinity around the object 5 and the detectors $33_1$, $33_2$ and also to withdraw contaminants in particular from the vacuum space 30 around the detectors $33_1$ and $33_2$, in order that said contaminants are not adsorbed on the surfaces of the substrates $35_1$ and $35_2$. In a similar manner, a cooling plate $43_2$ is arranged between the detectors $33_3$ and $33_4$, said cooling plate likewise being in contact with a cold reservoir 45.

Electrical lines such as, for example, voltage supply lines and signal lines for the operation of the X-ray detectors are led from the vacuum space 30 towards the outside through the tube 39 and are not shown in FIG. 1.

Figure 2:
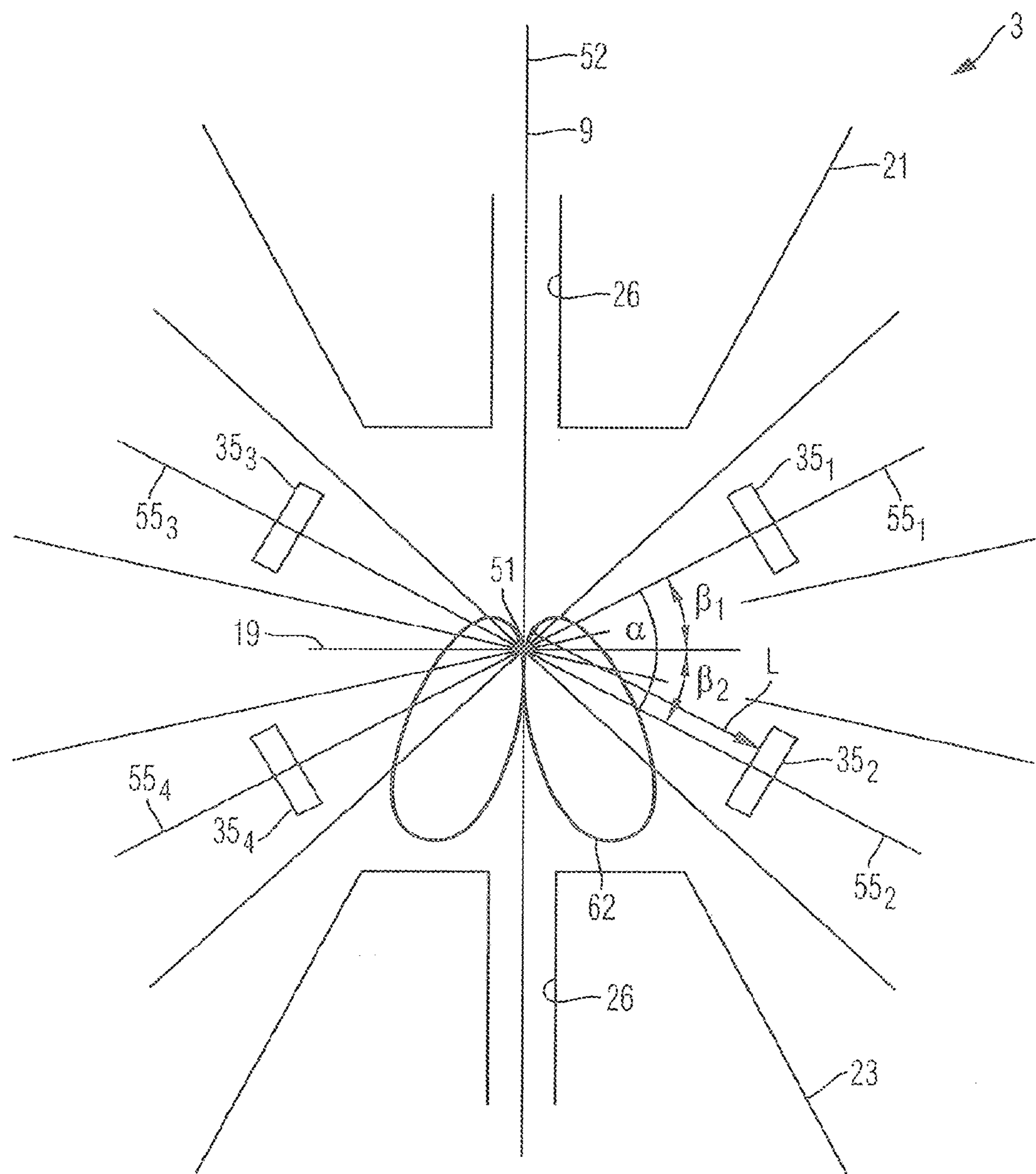
FIG. 2 is a schematic illustration of a detail from FIG. 1 for elucidating certain angular relations.

FIG. 2 is a schematic illustration for elucidating the arrangement of the substrates 35 of the X-ray detectors 33 with respect to a point of intersection 51 between the object plane 19 and an axis 52 of symmetry of the pole pieces 21, 23, which is simultaneously also the optical axis of the lens 3 and along which the electron beam 9 runs, wherein the latter can be deflected with respect to the axis 53 in order to scan it over the object arranged in the object plane 19.

FIG. 2 shows straight lines $55_1$, $55_2$, $55_3$ and $55_4$ which extend through the point of intersection 51 between the optical axis 53 and the object plane 19 and a center of one of the substrates $35_1$, $35_2$, $35_3$ and $35_4$. Main surfaces of the substrates 35 can be oriented orthogonally with respect to the straight lines 55, although this need not be the case. Furthermore, the substrates 35 are arranged at a distance L from the point of intersection 51 between the optical axis 53 and the object plane 19. Consequently, relative to the point of intersection 51 between the optical axis 53 and the object plane 19, each X-ray detector 33 covers a solid angle range Ω given approximately by $\Omega=A/L^2$, where A is the cross-sectional area of the substrate 35.

An angle α that is greater than 14° and less than 90° is formed between the straight lines $55_1$ and $55_2$ through the centers of the substrates $35_1$ and $35_2$, respectively. Consequently, the substrates $35_1$ and $35_2$ are arranged at different elevation angles with respect to the object plane 19. This has the following advantage:

A line 62 in FIG. 2 represents a spatial intensity distribution of continuous bremsstrahlung which is generated by impingement of an electron beam having a kinetic energy of 60 keV, for example, on a thin object at the point of intersection 51 between the optical axis 52 and the object plane 19. This angular distribution is rotationally symmetric with respect to the axis 52, although greatly dependent on the elevation angle with respect to the object plane 19. The two substrates $35_1$ and $35_2$ are exposed to different intensities of bremsstrahlung due to the angle α between the straight lines $55_1$ and $55_2$ through the centers of the substrates. The bremsstrahlung detected by the detectors forms a background for the radiation which is actually intended to be detected and evaluated in order to obtain information about the irradiated object, namely the characteristic X-ray radiation. The latter is generated at the point of intersection 51 between the optical axis 53 and the object plane 19 with a substantially isotropic spatial intensity distribution, such that both substrates $35_1$ and $35_2$ detect approximately identical proportions of characteristic X-ray radiation.

By jointly adapting the bremsstrahlung background in the spectra generated by the substrates $35_1$ and $35_2$, it is possible to determine the background particularly precisely and to remove it from the spectra, such that the remaining signal components in the spectra substantially exclusively represent the characteristic X-ray radiation generated at the object.

In the exemplary embodiment illustrated in FIG. 1, the two substrates $35_1$ and $35_2$ are arranged not only at different elevation angles with respect to the object plane 19, but also on different sides of the object plane. Thus, an elevation angle $\beta_1$ of the straight line $55_1$ can be in a range from −45° to −7° and an elevation angle $\beta_2$ of the straight line $55_2$ can be in a range from +7° to +45° with respect to the object plane.

In particular, the at least one X-ray detector arranged downstream of the object plane in the beam direction of the particle beam or electron beam can be arranged at an elevation angle with respect to the object plane whose absolute value is greater than the absolute value of the elevation angle of the at least one X-ray detector arranged upstream of the object plane in the beam direction of the particle beam or electron beam.

This achieves advantages in particular in the case of X-ray detectors which have a sensitivity which is dependent on the energy of the X-ray quanta and which decreases with increasing quantum energy of the X-ray quanta, as is the case for example for silicon drift detectors. This is because since the bremsstrahlung generated in the forward direction at the object is angle- and energy-dependent in such a way that principally higher-energy X-ray radiation emerges from the object at relatively large angles with respect to the optical axis, the bremsstrahlung background detected by the X-ray detectors arranged in the forward direction is smaller if the elevation angle at which the X-ray detectors arranged in the forward direction are arranged is larger with regard to its absolute value.

In the illustrated exemplary embodiment, the substrate $35_3$ is arranged in a manner lying diametrically opposite the substrate $35_2$ with respect to the point of intersection between the optical axis 53 and the object plane 19, and the substrate $35_4$ is arranged in a manner lying diametrically opposite the substrate $35_1$ with respect to the point of intersection 51. In other exemplary embodiments, an angle between the straight line $55_3$ and the straight line $55_4$ likewise is in a range of more than 14° and less than 90°. Likewise, an elevation angle of the straight line $55_3$ with respect to the object plane 19 can be in a range of −45° to −7°, and an elevation angle of the straight line $55_4$ with respect to the object plane 19 can be in a range of +7° to +45°.

In the exemplary embodiment illustrated, the object plane 19 is arranged centrally between the pole pieces 21 and 23, and the construction of the lens 3 is also approximately symmetrical with respect to the object plane 19. However, this is not necessarily the case. Rather, the construction of the lens 3 can also be asymmetrical with respect to the object plane 19, such that the object plane 19 is arranged, for example, nearer to the rear pole piece 23 than to the front pole piece 21.

Further embodiments of the invention are described below, wherein components which correspond to those of the embodiment described with reference to FIGS. 1 and 2 with regard to their construction and their function are identified by the same reference symbols and supplemented by an additional letter for distinguishing purposes.

Figure 3:
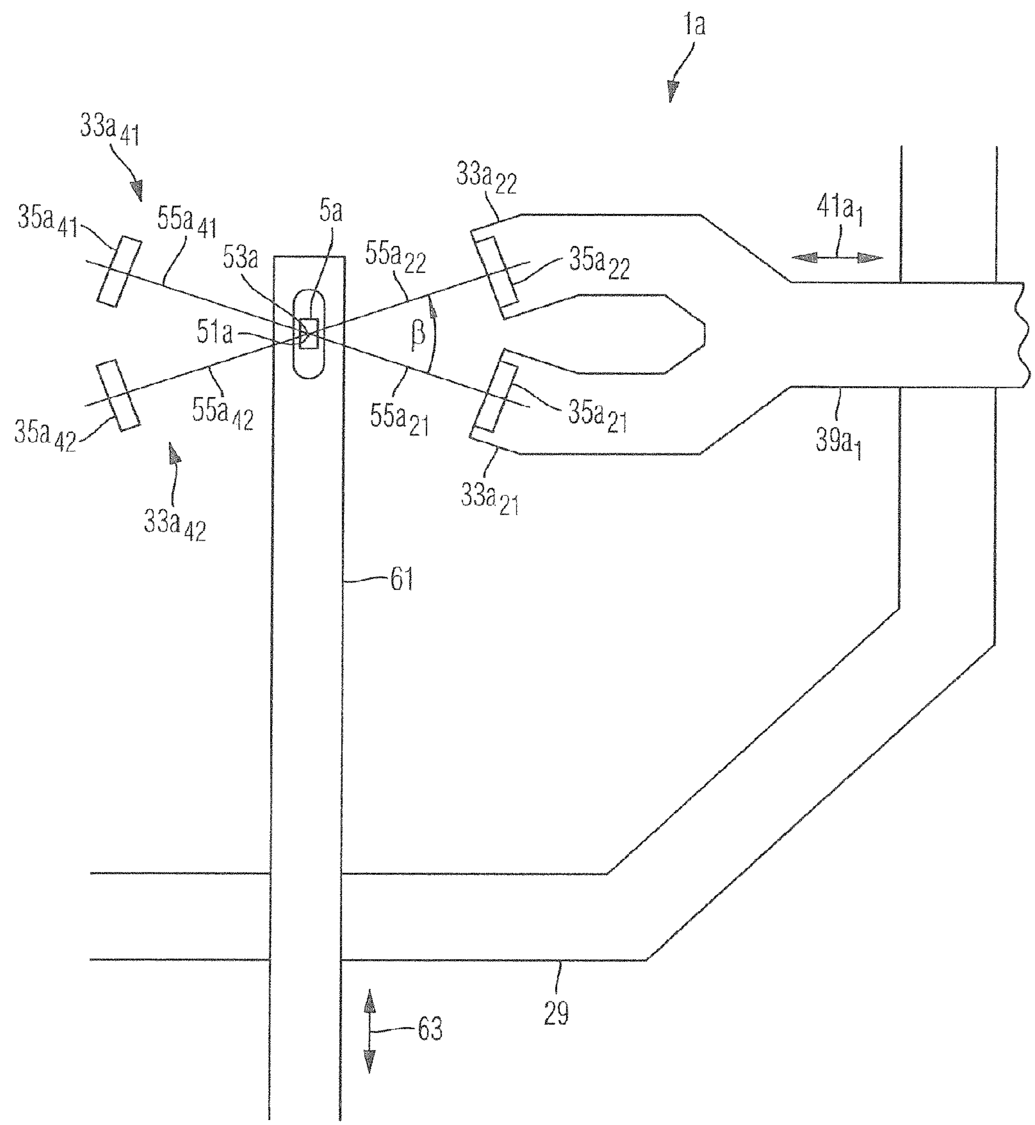
FIG. 3 is a schematic illustration of a cross section of the particle beam microscope shown in FIG. 1.

FIG. 3 is a schematic illustration of an electron microscope **1*a* in cross section parallel to an object plane of the microscope. The electron microscope 1*a* also has a plurality of X-ray detectors arranged at different elevation angles with respect to the object plane. The sectional illustration in FIG. 3** shows two X-ray detectors $33a_{21}$ and $33a_{22}$ having respective substrates $35a_{21}$ and $35a_{22}$. Straight lines $55a_{21}$ and $55a_{22}$ which extend through the point of intersection 51*a* between the optical axis 53*a* of the lens and the object plane and through a center of the respective substrate $35a_{21}$ and $35a_{22}$ form an angle β in projection onto the object plane, which angle can be within a range from 7° to 83°.

In FIG. 3 furthermore two substrates $35a_{41}$ and $35a_{42}$ of two further detectors are shown. The latter are arranged with respect to the point of intersection 51*a* between the optical axis 53*a* and the object plane in such a way that a straight line $55a_{41}$ through the point of intersection 51*a* and the center of the substrate $35a_{41}$ coincides with the straight line $55a_{21}$, and that a straight line $55a_{42}$ through the point of intersection 51*a* and the center of the substrate $35a_{42}$ in projection onto the object plane coincides with the straight line $55a_{22}$. With respect to the point of intersection 51*a* between the optical axis 53 and the object plane 19, the substrate $35a_{41}$ is arranged diametrically opposite a substrate of an X-ray detector not illustrated in FIG. 3. Likewise, the other substrates $35a_{42}$, $35a_{22}$ and $35a_{21}$ are respectively arranged diametrically opposite substrates of further X-ray detectors that are not illustrated in FIG. 3.

FIG. 3 furthermore shows a sample holder 61, which passes through the vacuum enclosure 29 and is movable at least in a direction represented by an arrow 63, in order to arrange the object 5*a* at the point of intersection 51*a* between the object plane and the optical axis 53*a*, such that the object 5*a* can be scanned by the electron beam, wherein the characteristic X-ray radiation generated is detected by the detectors.

Figure 4A:
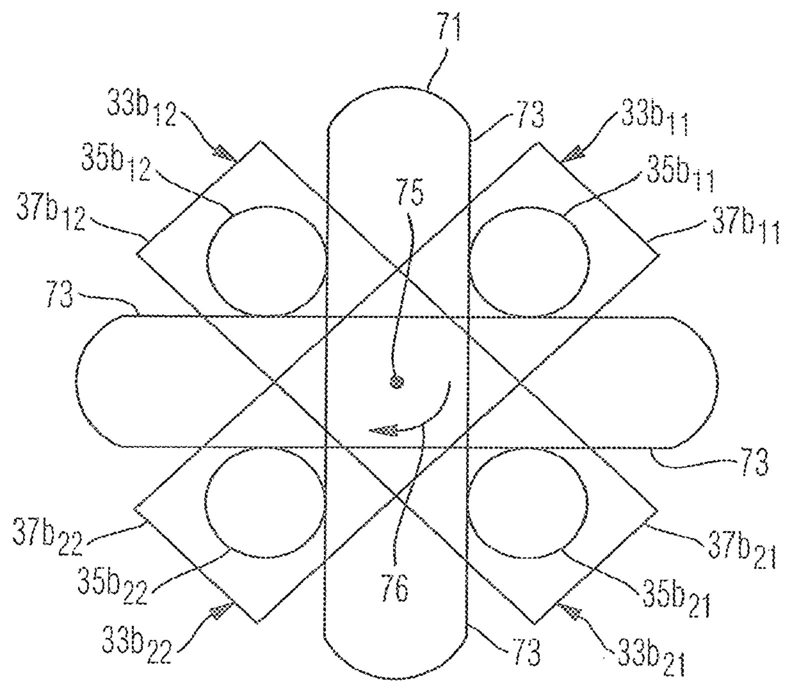
FIGS. 4*a*, 4*b* are plan views of a detector arrangement in two different positions of a shutter.

FIG. 4*a* shows a plan view of substrates $35b_{11}$, $35b_{22}$, $35b_{12}$ and $35b_{22}$ of X-ray detectors $33b_{11}$, $33b_{21}$, $33b_{12}$ and $33b_{22}$ of an electron microscope of a further embodiment. In this case, the substrates $35b_{11}$ and $35b_{12}$ are arranged upstream of the object plane, as seen in the direction of the beam path of the electron microscope, while the substrates $35b_{21}$ and $35b_{22}$ are arranged downstream of the object plane.

The four substrates 35*b* can be covered by a common shutter 71, in order to protect them against contaminants and impinging electrons and if a measurement of the X-ray radiation by the detectors 33*b* is not desired. The shutter has four blades 73 arranged in cruciform fashion and fixedly connected to one another and is rotatable about a rotation spindle 75 by a drive, as is indicated by an arrow 76 in FIGS. 4*a* and 4*b*. In the situation shown in FIG. 4*a*, the blades 73 are respectively arranged between two substrates 35*b*, such that they do not cover the latter and the measurement of X-ray radiation is possible.

Figure 4B:
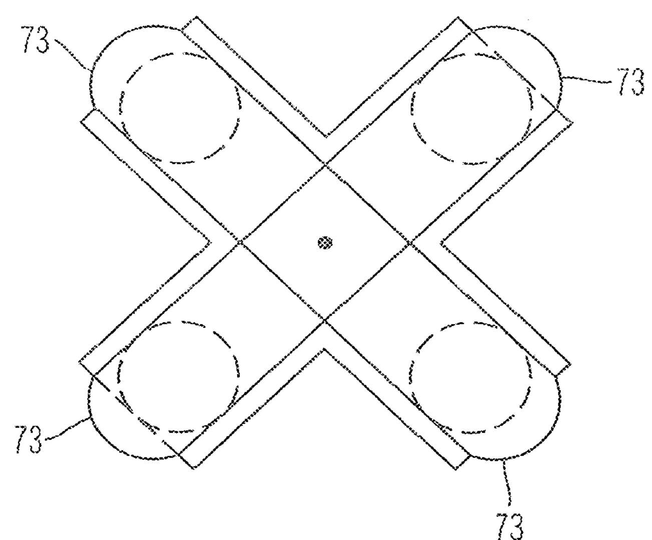

FIG. 4*b* shows the operating mode in which the substrates 35*b* of the detectors 33*b* are respectively covered by a blade 73 of the shutter 71, in order to protect them against contamination with contaminants and the impingement of electrons.

Figure 5:
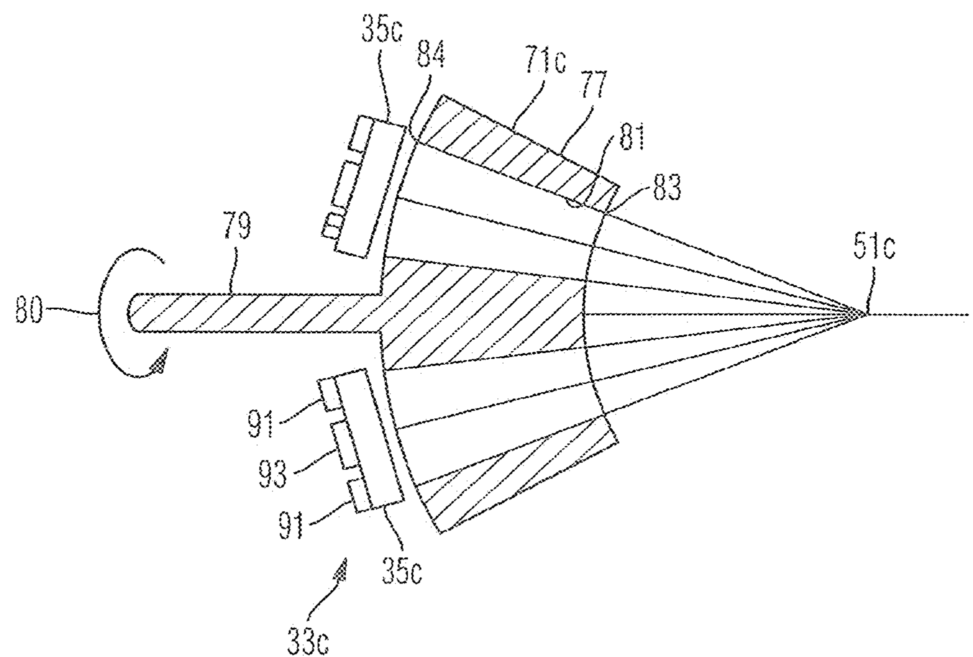
FIG. 5 is a schematic illustration of a longitudinal section through a shutter.
Figure 6:
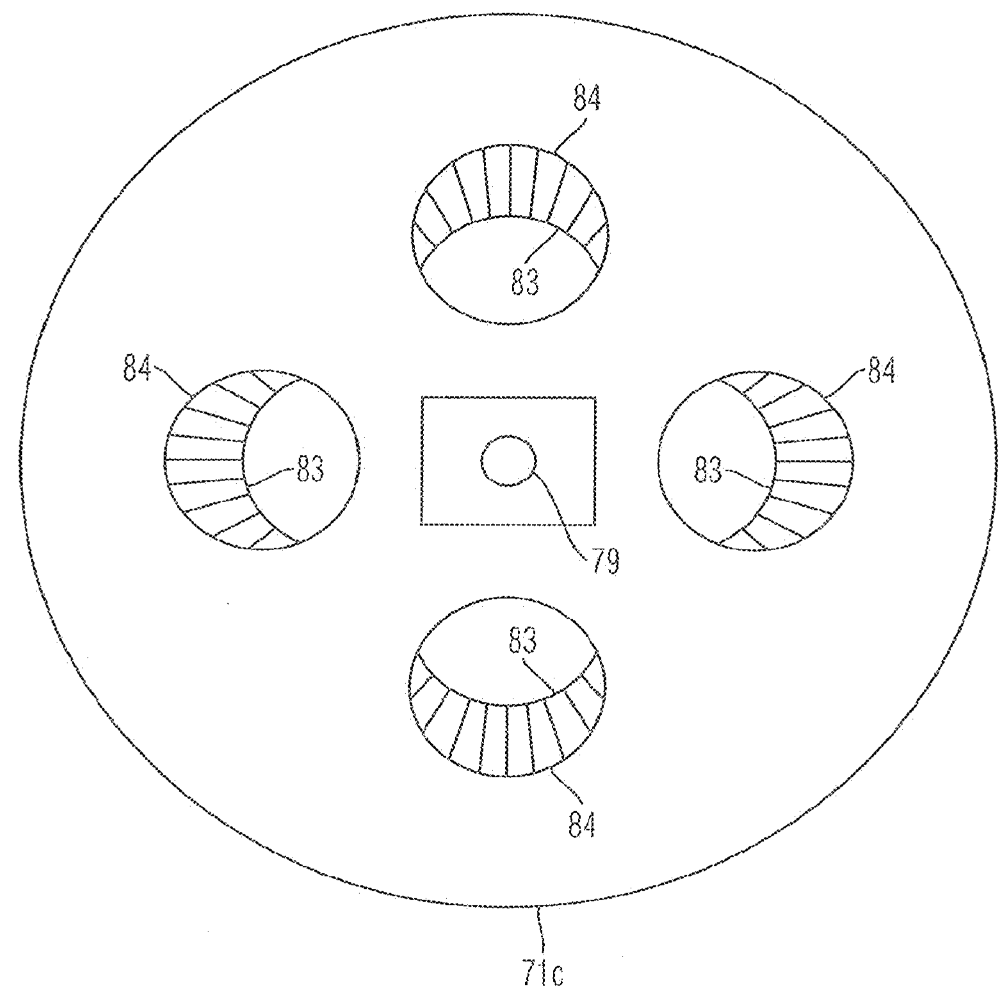
FIG. 6 is a plan view of the shutter shown in FIG. 5.

FIGS. 5 and 6 show a further embodiment of a shutter for protecting four substrates 35*c* against the impingement of contaminants and electrons. In this case, FIG. 5 is a schematic sectional illustration through the shutter 71*c*, while FIG. 6 is a schematic plan view of a side of the shutter 71*c* that faces the substrates.

The shutter is formed by a material block 77, which is mounted such that it is rotatable about a rotation spindle 79, as is indicated by an arrow 80. The material block 77 has four through-openings 81, the cross section of which in each case tapers conically proceeding from a substrate 35*c* towards a point of intersection 51*c* between the object plane and the optical axis of the electron microscope. The four through-holes 81 thus form four tubular pieces each having an opening 83 facing the point of intersection 51*c* between the optical axis and the object plane and an opening 84 facing the substrate 35*c*. The opening 84 facing the substrate 35*c* has a cross-sectional area approximately corresponding to the cross-sectional area of the substrate 35*c*. By contrast, the opening 83 facing away from the substrate 35*c* has a cross-sectional area that is significantly smaller than the cross-sectional area of the opening 84 facing the substrate 35*c*. Furthermore, a length of the tubular pieces or a distance between the openings 83 and 84 is greater than 0.6 times, and in particular greater than 0.9 times, a diameter of the substrate 35*c*. Therefore, the tubular pieces of the shutter 71*c* in each case act as a collimator for one of the detectors in order to suppress the impingement of stray radiation on the substrate 35*c* of the detector.

FIG. 5 illustrates the operating mode in which X-ray radiation emerging from the point of intersection 51*c* between the optical axis and the object plane is intended to be detected by the detectors. As a result of the shutter 71*c* being rotated in the direction of the arrow 80 by the driving of the spindle 79 by 45°, for example, it is possible to position the shutter 71 such that the material block 77 blocks the impingement of X-ray radiation emerging from the point of intersection 51*c* between the optical axis and the object plane on the substrates 35*c* of the detectors.

The X-ray detectors can be silicon drift detectors. In this respect, FIG. 5 shows Peltier elements 91, which are in thermally conductive contact with the substrates in order to cool the latter. By way of example, the Peltier elements 91 are designed such that the substrates can be operated at a temperature of −20° Celsius. The reference symbols 93 in FIG. 5 designate an electronic unit of the detector 33*c* that is assigned to the substrate 35*c*.

Figure 7:
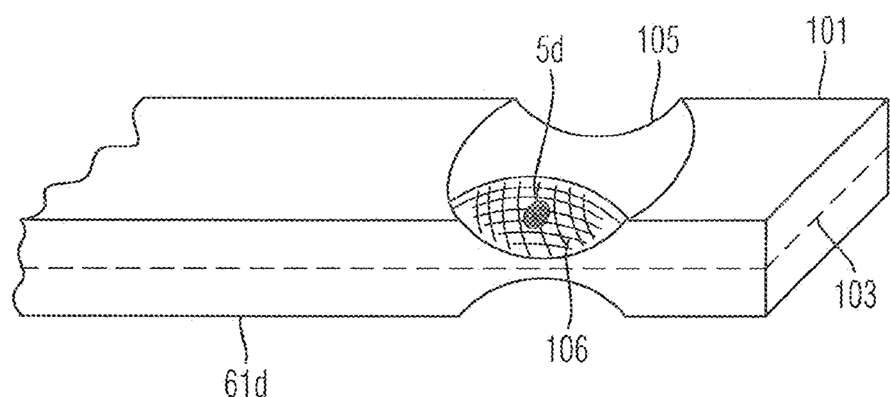
FIG. 7 is a perspective illustration of a sample holder suitable for mounting an object to be inspected.

FIG. 7 is a simplified perspective illustration of a sample holder 61*d*, which can be used for mounting an object 5*d* to be examined in an object plane of an electron microscope. The sample holder 61*d* comprises a rod 101 of rectangular cross section, for example, which can be produced from metal, for example. The rod 101 has cutouts or apertures 105 which are symmetrical with respect to a central plane 103 of the rod and which define a through-hole in which a net 106 is arranged, on which the object 5*d* is fitted in order to arrange it in the object plane of the electron microscope.

In this case, the apertures 105 are embodied such that X-ray radiation emerging from the object 5*d* can pass towards the X-ray detectors, without being shaded by the material of the rod 101.

Figure 8:
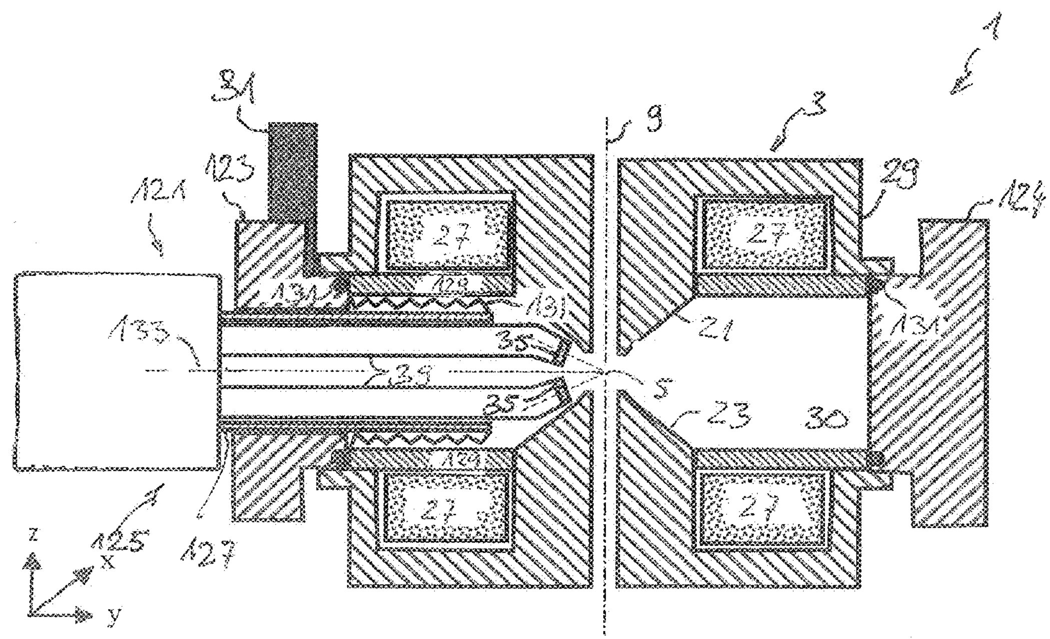
FIG. 8 is a schematic illustration of a particle beam microscope in a longitudinal section.
Figure 9:
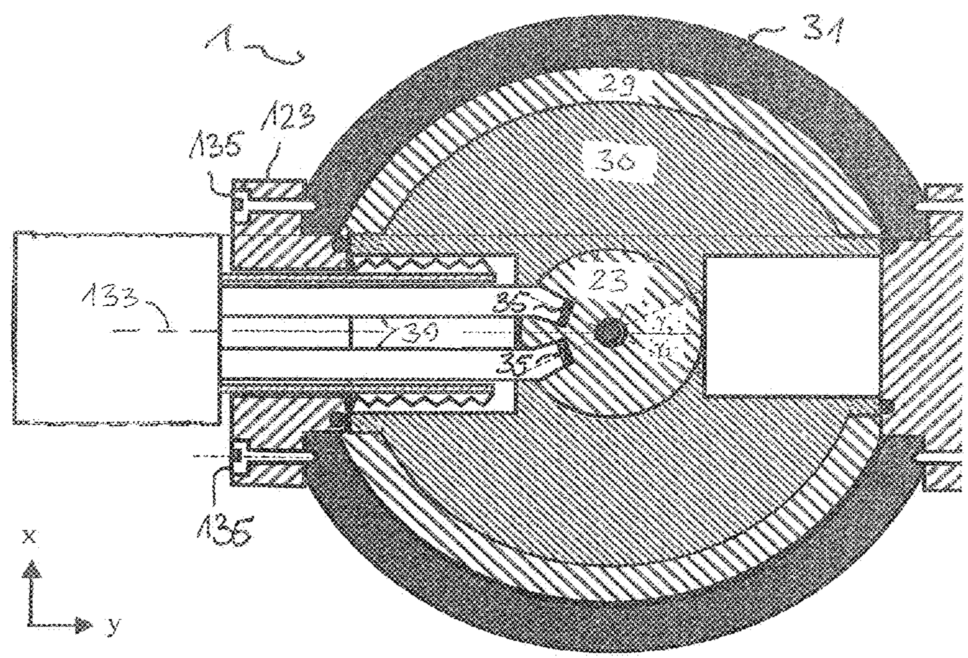
FIG. 9 is a schematic illustration of a cross-section of the particle beam microscope shown in FIG. 8.

FIGS. 8 and 9 illustrate a further example of a particle beam microscope, wherein FIG. 8 shows a portion of the microscope 1 in a longitudinal section, similar to FIG. 1, and FIG. 9 shows a portion of the microscope 1 in a cross section, similar to FIG. 3.

The microscope 1 shown in FIGS. 8 and 9 has a configuration which is very similar to the configuration of the microscopes illustrated above with reference to FIGS. 1 to 7. In particular, four substrates 35 of X-ray detectors are arranged close to a point of intersection 5 between an optical axis of an objective lens 3 of the microscope 1 and a sample plane. In particular, the angular relations between the substrates 35 relative to the point of intersection can be the same as illustrated above.

The microscope 1 comprises a X-ray detection unit 121 which comprises four X-ray detectors including the substrates 35, a flange 123 and a detector mount 125. The detector mount 125 carries tubes 39 on which the detectors are mounted. The detector mount 125 further comprises a tube 127 surrounding the tubes 39 and extending through an opening in the flange 123. The flange 123 is sealed against a vacuum enclosure 131 and a plate 129 which covers coils 27 of the objective lens 3. The plate 129 is further sealed against pole pieces 21, 23 and a yoke 29 of the objective lens 3 such that the coils 27 can be operated outside of the vacuum of the vacuum space 30 defined by the vacuum enclosure 31. A representative sealing is indicated at 131 in FIGS. 8 and 9. A corrugated bellows 131 extends between the flange 123 and a tip end of the tube 127 to provide a vacuum type sealing between the flange 123 and the mounting structure 125 such that the mounting structure 125 can be displaced relative to the flange 123 along a longitudinal axis 133 which intersects the optical axis 9 and the object plane at the intersection point 5. With such arrangement, the X-ray sensitive substrates 35 can be positioned close to the point of intersection 5 when the X-ray detectors are used for performing X-ray measurements, and, due to the elastic corrugated bellows 131, the detector substrates 35 can be positioned farther away from the point of intersection when the X-ray detectors are not used.

Still further, the X-ray detection unit 121 can be removed from the microscope by removing the flange 123 from the microscope. The flange 123 can be easily removed from the microscope since it is connected to the vacuum enclosure 31 by bolds 135.

The flange 123 included in the X-ray detection unit can be replaced by a flange 124 shown on the right side in FIGS. 8 and 9 in order to close the remaining opening in the vacuum enclosure 31.

Moreover, a second X-ray detection unit can be mounted on the microscope in place of the flange 124 shown in FIGS. 8 and 9.

Figure 10:
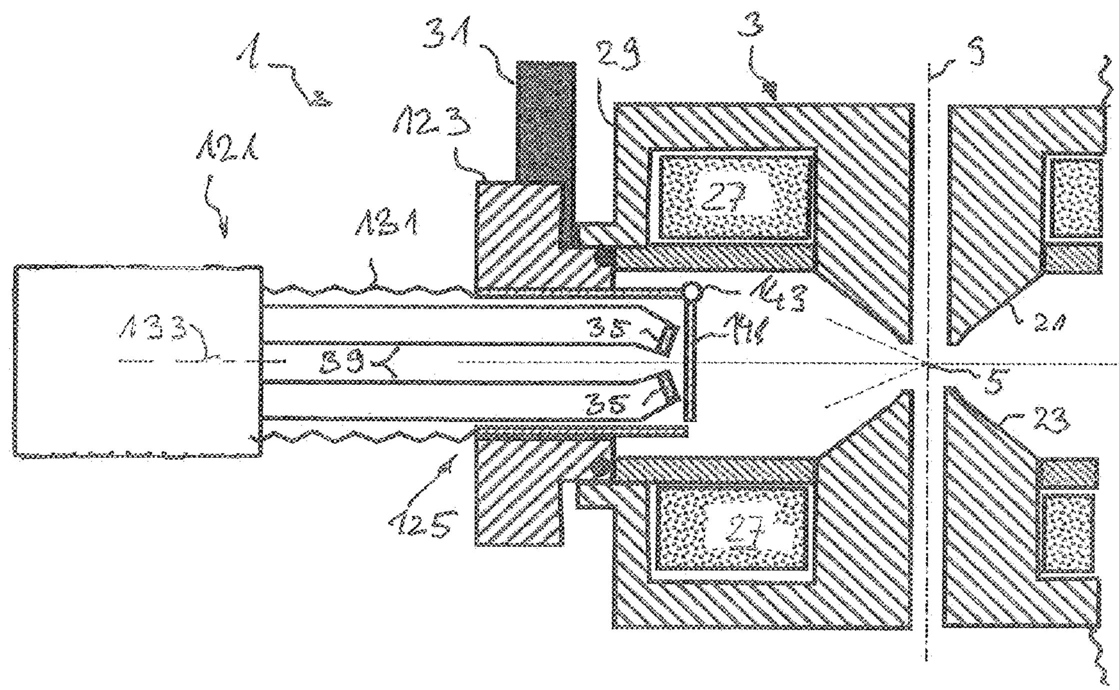
FIG. 10 is a schematic illustration of a particle beam microscope in a longitudinal section, wherein a X-ray detection unit is in a parking position.
Figure 11:
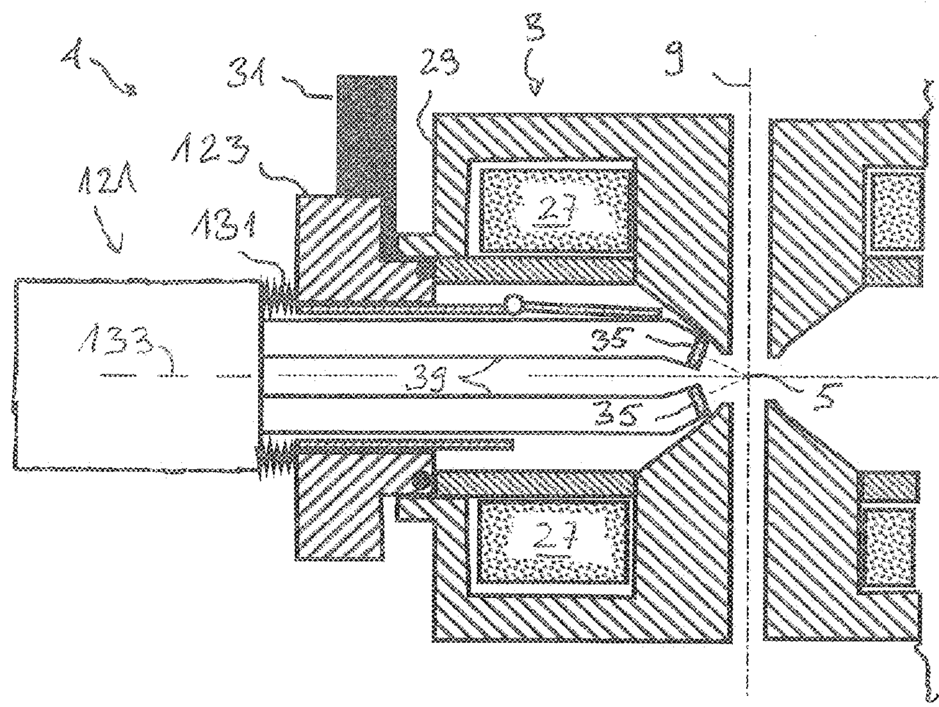
FIG. 11 is a schematic illustration of the particle beam microscope shown in FIG. 10 in a longitudinal section, wherein the X-ray detection unit is in a measuring position.

FIGS. 10 and 11 are longitudinal sections of a portion of a particle beam microscope 1, wherein an X-ray detection unit 121 is in a parking position in FIG. 10, and wherein the X-ray detection unit 121 is in the measuring position in FIG. 11. In the measuring position, substrates 35 of X-ray detectors are close to a point of intersection 5 between an optical axis 9 and an object plane. In the parking position shown in FIG. 10, the substrates 35 are positioned farther away from the point of intersection 5 and protected by a shutter plate 141 against radiation and particles released from a sample at the point of intersection 5 during operation of the microscope when X-ray detection using the substrates 35 is not desired.

The shutter plate 141 is hinged to a detector mount 125 by a hinge 143 such that is oriented by gravity such that the substrates 35 are protected when the X-ray detection unit is in the parking position. On the other hand, when the X-ray detection unit 121 is displaced toward it's measuring position, the hinge allows opening of the shutter plate 141, as shown in FIG. 11, such that it is no longer positioned between the substrates 35 and the point of intersection 5.

Apart from the shutter plate 141, the configuration of the microscope shown in FIGS. 10 and 11 is similar to the microscope shown in FIGS. 8 and 9. Further, the microscope shown in FIGS. 10 and 11 differs from the microscope shown in FIGS. 8 and 9 in that a corrugated bellows 131 is provided outside of the flange 123 in the example shown in FIGS. 10 and 11, whereas it is provided inside the flange 123 in the example shown in FIGS. 8 and 9.

The particle beam microscopes described in the embodiments explained above are transmission electron microscopes whose electron detector is arranged on an opposite side with respect to the object plane of the electron source and detects electrons transmitted by the object. However, the present disclosure is not restricted thereto. Rather, the described configuration of X-ray detectors can also be used on other types of electron microscopes in which an electron detector is arranged on a same side as the electron source with respect to the object plane and detects electrons, such as backscattered electrons and secondary electrons, for example, which are caused by primary electrons impinging on the object.

The magnetic lens used for focusing the particle beam onto the object can be used in combination with a likewise focusing electrostatic lens.

The particle beam microscopes described in the embodiments explained above have magnetic lenses having a pole piece arranged in the beam path upstream of the object and a pole piece arranged in the beam path downstream of the object.

In accordance with other embodiments provided, both pole pieces of the magnetic lens that focuses the beam onto the object are arranged in the beam path upstream of the object.

In the embodiments explained above, the particle beam microscopes explained are transmission electron microscopes by way of example. However, the present disclosure is not restricted thereto. In accordance with other exemplary embodiments, the particle beam microscope can also comprise a scanning electron microscope in which a focused electron beam is scanned over the object and the interaction products initiated or generated by the electron beam at the object are detected for image generating purposes in a manner dependent on the position at which the electron beam impinges on the sample.

In accordance with other exemplary embodiments, the particle beam microscope can also comprise an ion microscope, such as a gas field ion microscope, for example, in which a particle beam is generated by gas atoms being ionized in an electrostatic field of an emission tip. The object is then irradiated with the ion beam, and the X-ray quanta arise as a result of the interaction of the ions of the ion beam with the atoms of the object. If the particle beam microscope is designed as an ion microscope, the objective lens need not necessarily be a magnetic lens, but rather can also be an electrostatic objective lens, which then has no pole pieces.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way.

Various changes may be made without departing from the spirit and scope of the present invention as defined in the following claims.

The invention claimed is:

1. A particle beam microscope having a beam path, the microscope comprising:

a magnetic lens having an optical axis and at least one front pole piece arranged in the beam path along the optical axis at a distance upstream of an object plane;

an object holder, which is configured for mounting an object to be inspected at a point of intersection between the optical axis and the object plane;

a vacuum enclosure defining a vacuum space and having an opening, wherein the front pole piece of the magnetic lens and the object are located within the vacuum space; and an X-ray detection unit;

wherein the X-ray detection unit comprises:

a detector mount;

a first X-ray detector mounted on the detector mount and having a first radiation-sensitive substrate;

a second X-ray detector mounted on a detector mount and having a second radiation-sensitive substrate;

a flange mounted on and sealed against the vacuum enclosure, wherein the flange carries the detector mount such that at least one of a portion of the flange and the detector mount extend through the opening of the vacuum enclosure;

wherein the first and second X-ray detectors are arranged such that a first elevation angle between a first straight line extending through the point of intersection and a center of the first substrate and the object plane differs from a second elevation angle between a second straight line extending through the point of intersection and a center of the second substrate and the object plane by more than 14°; and wherein the flange and the opening have a diameter such that the X-ray detection unit can be removed from the particle beam microscope without dismantling the vacuum enclosure.

2. The particle beam microscope according to claim 1, wherein a central axis of the flange is oriented towards the point of intersection between the optical axis and the object plane.

3. The particle beam microscope according to claim 2, wherein a central axis of the flange intersects the point of intersection between the optical axis and the object plane.

4. The particle beam microscope according to claim 1, wherein the first elevation angle is within a range from −45° to −7° and the second elevation angle is within a range from +7° to +45°.

5. The particle beam microscope according to claim 4, wherein a distance of the first and second radiation-sensitive substrates from the point of intersection is between 12 mm and 20 mm.

6. The particle beam microscope according to claim 5, wherein a distance of the first and second radiation-sensitive substrates from the point of intersection is less than 12 mm.

7. The particle beam microscope according to claim 1, wherein the X-ray detection unit further comprises: a third X-ray detector mounted on the detector mount and having a third radiation-sensitive substrate, and a fourth X-ray detector mounted on the detector mount and having a fourth radiation-sensitive substrate.

8. The particle beam microscope according to claim 7, wherein the third and first X-ray detectors are arranged such that a first circumferential angle about the optical axis between a third straight line extending through the point of intersection and a center of the third substrate and the first straight line is greater than 14°; and wherein the fourth and second X-ray detectors are arranged such that a second circumferential angle about the optical axis between a fourth straight line extending through the point of intersection and a center of the fourth substrate and the second straight line is greater than 14°.

9. The particle beam microscope according to claim 8, wherein a third elevation angle between the third straight line and the object plane is equal to the first elevation angle; and wherein a fourth elevation angle between the fourth straight line and the object plane is equal to the second elevation angle.

10. The particle beam microscope according to claim 1, wherein the detector mount is displaceable relative to the flange such that the first and second X-ray detectors are displaceable from a measuring position near the point of intersection to a parking position farther away from the point of intersection.

11. The particle beam microscope according to claim 10, further comprising a displaceable shutter plate which is arranged between the first and second radiation-sensitive substrates and the point of intersection when the first and second X-ray detectors are positioned in the parking position, and which is not arranged between the first and second radiation-sensitive substrates and the point of intersection when the first and second X-ray detectors are positioned in the measuring position.

12. The particle beam microscope according to claim 10, wherein a distance of the first and second radiation-sensitive substrates from the point of intersection is between 12 mm and 20 mm when the first and second X-ray detectors are positioned in the measuring position.

13. The particle beam microscope according to claim 10, wherein a distance of the first and second radiation-sensitive substrates from the point of intersection is less than 12 mm when the first and second X-ray detectors are positioned in the measuring position.

14. The particle beam microscope according to claim 1, wherein the first and second substrates each have a substrate area of greater than 5 $mm^2$.

15. The particle beam microscope according to claim 1, wherein the first and second radiation-sensitive substrates each have a substrate area of less than 50 $mm^2$.

16. The particle beam microscope according to claim 1, wherein the first and second X-ray detectors are silicon drift detectors.

17. The particle beam microscope according to claim 1, wherein the first and second X-ray detectors comprises at least one Peltier element configured to cool the radiation-sensitive substrate.

18. The particle beam microscope according to claim 1, wherein the magnetic lens comprises a rear pole piece arranged in the beam path downstream of the object plane at a distance of less than 50 mm from the object plane.

19. The particle beam microscope according to claim 1, wherein the microscope comprises plural X-ray detection units distributed about the optical axis;

wherein the vacuum enclosure has plural openings; and wherein at least one of a portion of the flange and the detector mount of each of the plural X-ray detection units extend through one of the plural openings of the vacuum enclosure.

* * * * *